United States Patent [19]

Legrady et al.

[11] Patent Number: 5,241,744
[45] Date of Patent: Sep. 7, 1993

[54] METHOD OF INDIVIDUALLY INSERTING TERMINALS CONNECTED IN A STRIP AND APPARATUS FOR CARRYING OUT THE METHOD

[75] Inventors: Janos Legrady, Putnam Valley, N.Y.; Hal Wylie, New Town, Conn.; Greg Torigian; Jim Dicaprio, both of Mahopac, N.Y.

[73] Assignee: Zierick Manufacturing Corporation, Mount Kisco, N.Y.

[21] Appl. No.: 882,149

[22] Filed: May 12, 1992

[51] Int. Cl.$^5$ .................... H01R 9/00; B23P 19/00
[52] U.S. Cl. ........................ 29/845; 29/739; 29/759; 29/566.2; 83/112
[58] Field of Search ............. 29/842, 845, 739, 759, 29/564.6, 566.1, 566.2; 83/112

[56] References Cited

U.S. PATENT DOCUMENTS

| | | | |
|---|---|---|---|
| 4,543,714 | 10/1985 | Seffernick et al. | 29/845 |
| 4,598,471 | 7/1986 | Elsbree, Jr. et al. | 29/845 |
| 4,642,872 | 2/1987 | Grabbe et al. | 29/564.6 |

OTHER PUBLICATIONS

Zahn, Irwin; Autotab: An Advanced PWB Terminal Insertion System; 13th Annual Connector Symposium.; Phila., Pa.; pp. 403-410; Autosplice Div,, General Staple Co. Oct. 8-10, 1980.

*Primary Examiner*—P. W. Echols
*Attorney, Agent, or Firm*—Lackenbach, Siegel, Marzullo, Aronson & Greenspan

[57] ABSTRACT

An apparatus is described for individually inserting successive components of a series of components having mounting legs by movement of the components along an insertion direction to introduce the mounting legs into holes in a substrate at an insertion station. The apparatus includes a guide for guiding a strip of components along a feedpath generally normal to the insertion direction with the mounting legs oriented in the direction of the substrate surface. The strip is advanced stepwise after each insertion operation to position the next successive components of the strip at the insertion station. The carrier web between a components to be inserted and the next successive upstream component is centered relative to a web shearing line, a first cutting element at the insertion station being arranged for abutment against a carrier edge or line proximate to the mounting legs for preventing movement of that portion of the carrier web upstream of the shearing line in the insertion direction. The strip is moved relative to the cutting element to permit the strip to advance the next successive component to be inserted to the insertion station without being blocked by the first cutting element. A plunger is provided which moves along the insertion direction to shear the carrier web when the plunger is driven into engagement with that portion of the carrier web downstream of the shearing line and move it below the carrier edge or line. An insertion spoon carries the component towards and inserts it through the substrate.

20 Claims, 3 Drawing Sheets

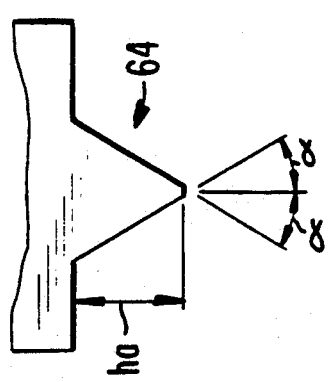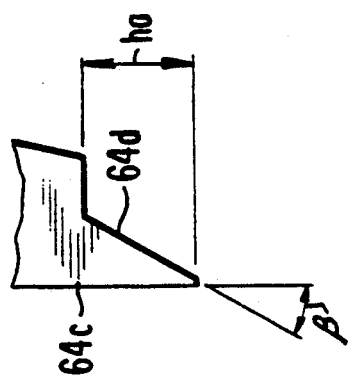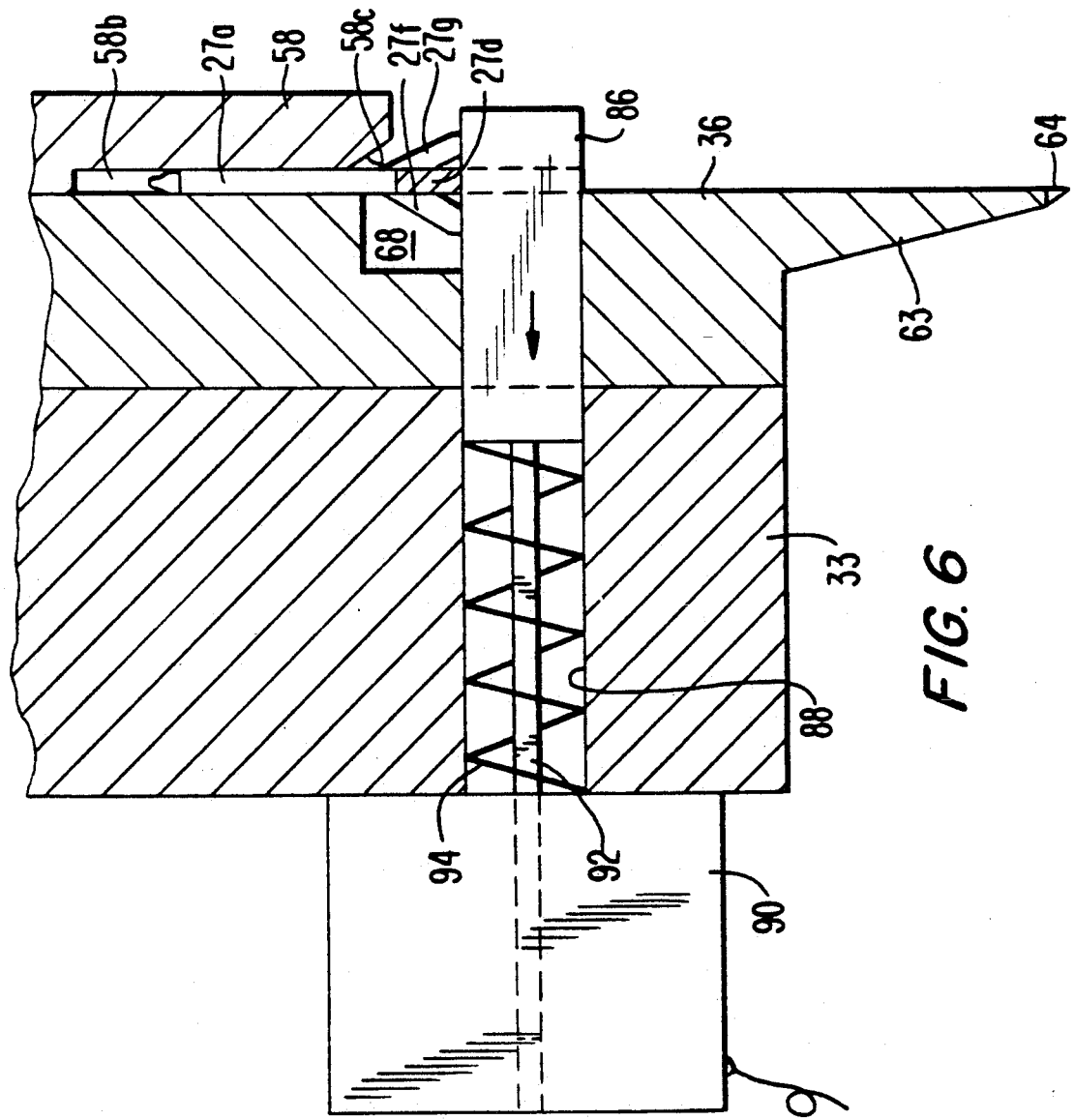

METHOD OF INDIVIDUALLY INSERTING TERMINALS CONNECTED IN A STRIP AND APPARATUS FOR CARRYING OUT THE METHOD

BACKGROUND OF THE INVENTION

1. Field of the Invention

This invention generally relates to a method of individually inserting terminals connected in a strip into printed circuit boards (or similar substrate) for the electronics industry, and the apparatus for carrying out the method.

2. Background of the Invention

The purpose of terminal insertion equipment is to index continuous strip terminals packaged on reels and individually shear the terminals from their integral carrier strip and insert them into a printed circuit board (PCB) or other substrate. Presently, semi-automatic insertion equipment for the electronics industry share some common features. For example, terminals are commonly fed through a stationary feedtrack by an air cylinder driven feedfinger. Terminals are removed from their integral carrier strips by horizontal shear motion across the carrier strip material thickness. The sheared terminal subsequently is vertically inserted into a printed circuit board with a pneumatically driven plunger. The proper location of the printed circuit board is achieved through the aid of locating pins and anvils protruding upward from the flat surface of a lower tooling module. Typically, the printed circuit board is stationary during the insertion cycle.

Numerous insertion machines have been devised for inserting terminal pins and other components into apertures of printed circuit boards and other substrates. When the terminal pins are connected in a strip, the insertion equipment must first sever the pins from the strip prior to insertion. Frequently, this entails a separate shearing step. However, the provision of separate cutting elements increases the number of moving components of the machine, rendering the machine more expensive and susceptible to breakdown.

While some insertion equipment is very sophisticated and can fully automatically insert, by means of computer control, numerous terminals into printed circuit boards, such fully automated machines are very expensive and are not always required for simple applications.

In U.S. Pat. No. 4,598,471 to Elsbree, Jr. et al., a pin inserter for electronic boards is disclosed wherein a mechanism is provided for rotating the connecting webbing in order to twist the webbing and break the pins off the carrier strip. Not only does this arrangement suffer the disadvantages of cost and reliability aforementioned, but the pins themselves may be damaged or bent and the carrier strip is not severed along a clean sharp edge.

In U.S. Pat. No. 4,543,714 to Seffernick et al., an insertion machine is described for inserting circuit module terminals. A carrier web is periodically advanced in stepwise manner. While the substrate follows a path of advancement, a separation apparatus is used which subjects the terminals to a blast of compressed air which propels the separated terminals toward the substrate. This apparatus, in addition to its inherent complexity, can only be used for limited applications.

SUMMARY OF THE INVENTION

Accordingly, it is a primary object of the present invention to provide a component insertion machine which does not have the disadvantages inherent in such prior art machines.

It is another object of the present invention to provide a component insertion machine which is simple in construction and economical to manufacture.

It is still another object of the present invention to provide a component insertion machine which is reliable and simple and convenient to use.

It is yet another object of the present invention to provide a component insertion machine which can use interchangeable tooling for different terminals.

It is a further object of the present invention to provide a component insertion machine for inserting terminals connected in a strip which can feed a strip of terminals through a pivoting feedtrack in order to avoid a lower cutting element in the feedpath.

It is still a further object of the present invention to provide a component insertion machine which has a plunger descend on a single terminal forcing it and the track to rotate from its resting position, this action forcing the terminal inward over a fixed cut-off cutting element.

It is yet a further object of the present invention to provide a vertically descending insertion plunger which also serves as a cutting element, so that the steps of severing the terminal to be inserted and the insertion step are achieved by the same moving element in a single stroke.

It is an additional object of the present invention to provide a component insertion machine which shears the carrier webs connecting adjacent terminals or components along the height direction and not through the thickness direction of the carrier webs.

It is yet an additional object of the present invention to provide a component insertion machine which utilizes alignment points in the shape of pyramids or cones cut through longitudinal planes extending through the axis of the cones or pyramids, allowing the alignment points to occupy only half of the holes into which the legs of the components to be inserted are to be received, allowing the unoccupied portions of the holes in the printed circuit boards to be filled with the legs of the sheared terminal during insertion, this permitting simple and positive alignment of the printed circuit board holes with the insertion machine.

It is a further additional object of the present invention to provide a component insertion machine which utilizes a stationary lower anvil which provides a stop for a descending printed circuit board or other substrate while allowing a terminal to be inserted to continue downwardly for full seating and splaying to mechanically hold the terminal in the printed circuit board or similar substrate.

SUMMARY OF THE INVENTION

In order to achieve the above objects, as well as others which will become apparent hereafter, an apparatus in accordance with the present invention is used for individually inserting successive ones of a series of components having mounting legs into holes in a substrate surface at an insertion station. The components are uniformly spaced and arranged in an elongate strip with adjacent components being connected to each other by carrier webs. The apparatus comprises dispensing means for dispensing the strip of components. Guide means are used for guiding the dispensed strip of components along a feedpath generally normal to said insertion direction with the mounting legs oriented in the direction of the substrate surface. Advancing means are provided for stepwise advancing the strip after each insertion operation to position the next successive element of the strip at the insertion station and centering the carrier web, between the component to be inserted and the next successive upstream component, relative to a web shearing line. First cutting means are provided arranged at said insertion station and arranged below a carrier line defined by the carrier webs and for preventing movement of a portion of the carrier web upstream said shearing line in said insertion direction. Means are provided of for relatively moving the strip and said cutting element to permit the strip to advance to the next successive component to be inserted to said insertion station without being blocked by said first cutting element. Plunger means are provided mounted for movement along said insertion direction and normally disposed at a position on the opposite side of said carrier line and provided with a second cutting element arranged relative to said first cutting element to shear a carrier web once a plunger is driven into engagement with that portion of the carrier web downstream of said shearing line and moved below said carrier line. An insertion spoon is provided for receiving and carrying the component to the substrate surface. In this manner, the component to be inserted is initially moved to said insertion station and is subsequently severed from the strip by cutting the carrier web and subsequently inserting the mounting legs of the component into selected holes in the substrate surface in a single stroke of said plunger means. The invention also includes the method carried out by the aforementioned apparatus.

BRIEF DESCRIPTION OF THE DRAWINGS

Other features and advantages of the invention will be apparent upon consideration of the following detailed description when considered in conjunction with the drawings, wherein:

FIG. 5A is a enlarged front elevational view of an alignment point shown in FIG. 2;

FIG. 5B is a side elevational view of the alignment point shown in FIG. 5A; and

FIG. 6 is similar to FIG. 3 but showing an alternate embodiment of the invention in which the feedtrack is stationary but the lower cutting element is slidably mounted for movement into and out of the feedpath of the strip of components or elements.

DESCRIPTION OF THE PREFERRED EMBODIMENTS

Figures 1, 2:
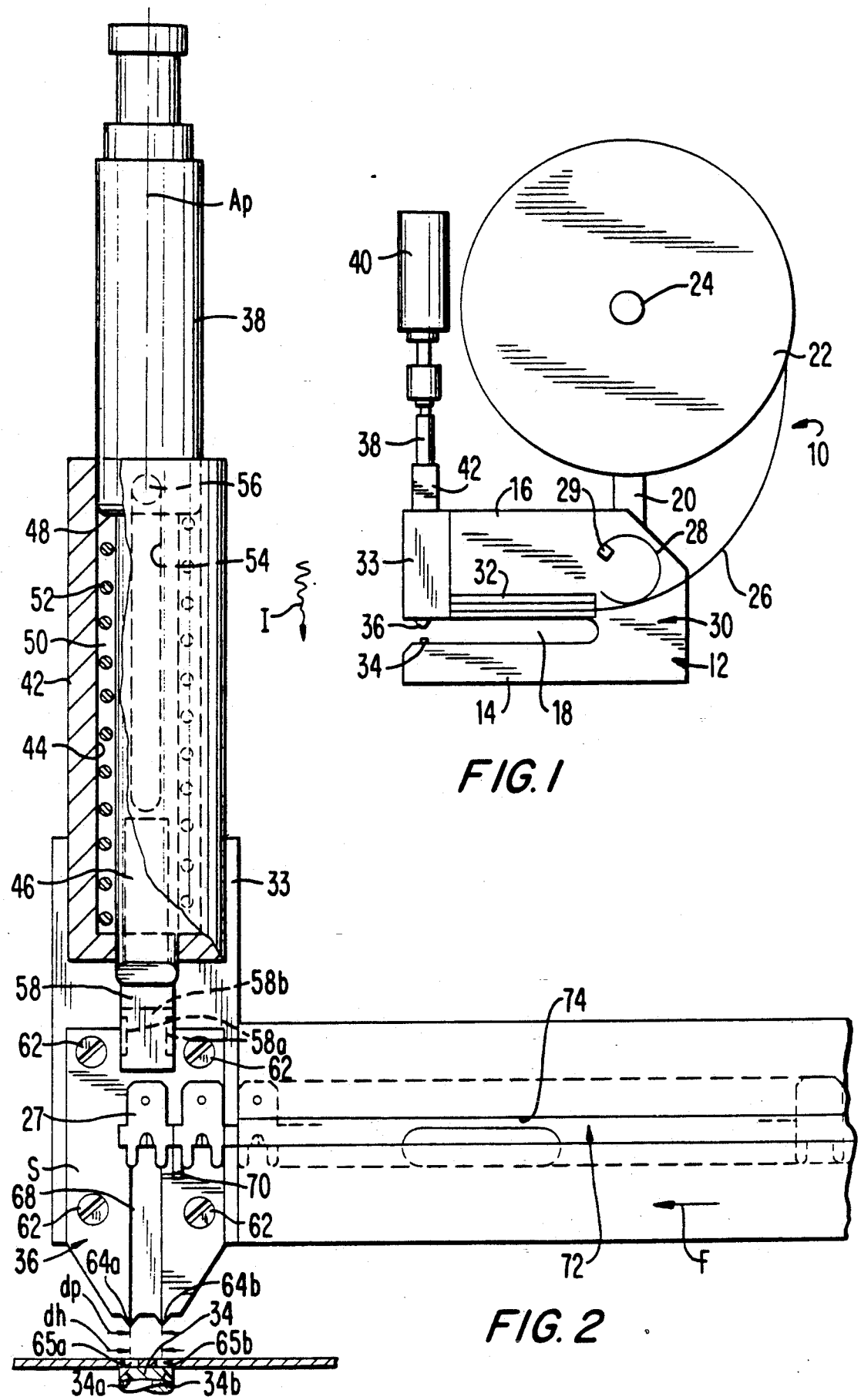
FIG. 1 is a side elevational view of a semi-automatic component insertion machine in accordance with the present invention, showing a reel or cartridge for dispensing a strip of components and same being guided along a feedpath toward an insertion station.
FIG. 2 is a front elevational view (operator's view) partially illustrating details of the plunger and feedtrack assemblies, showing a terminal at the insertion position and the insertion plunger in its retracted position at the beginning of an insertion stroke.

Referring now specifically to the drawings, in which identical or similar parts are designated by the same reference numerals throughout, and first referring to FIG. 1, a semi-automatic terminal insertion machine in accordance with the present invention is generally designated by the reference numeral 10.

The insertion machine 10 includes a C-frame 12 which includes a base 14 and upper support portion 16 spaced above the base 14 to provide a space 18 therebetween.

Supported on the frame 12 is an upwardly extending support arm 20 which supports a reel or a cartridge 22 of components mounted in strip form to provide a continuous supply of components having mounting legs adapted to be received within holes in a substrate. While it will be evident to those skilled in the art that the pin insertion machine 10 to be described can be used to insert many different types of components, the machine will be described, by way of example, in connection with the insertion of flat terminals having two-spaced mounting legs, the terminals being uniformly spaced from each other and arranged in an elongate strip with adjacent terminals being connected to each other by means of carrier webs of the type shown and disclosed in U.S. Pat. No. 4,688,866 assigned to Ziereck Manufacturing Corporation of Mount Kisco, N.Y.

The reel 22 is rotatably mounted on shaft 24 so that the reel is freely rotatable for dispensing the strip of terminals 26.

An arcuate deflector or guide 28 is mounted by means of mounting member 29 on the upper support portion 16, being positioned for guiding the dispensed strip 26 along a feedpath 30 generally normal to an insertion direction, with the mounting legs oriented in the direction of the substrate surface into which the terminals are to be mounted, as will be described below. Conventional means may be used for advancing the strip in stepwise movements after each insertion operation to position the next successive element of the strip at the insertion station.

In the embodiment being described, the feed direction 30 is generally horizontal, although this is not critical.

After being deflected by the guide 28, the strip of terminals 26 is received within a feedtrack 32, as will be more fully described in connection with FIGS. 1 and 3. The feedtrack 32 is pivotably mounted, as in FIGS. 1 and 3 or may be fixed in position or stationary as in FIG. 6. Both embodiments will be described in connection with the associated figures. Once in the feedtrack 32, the strip of terminals 26 is advanced toward the main mounting block 33.

Disposed on the lower side of the space 18 on the base 14 is a splaying anvil 34 while an insertion nose plate 36 is mounted above the anvil 34 on the mounting block 33. The anvil 34 and the nose plate 36 are aligned along a vertical insertion direction axis normal to the feed direction 30. Co-extensive with the insertion direction axis is a movable insertion punch 38 which is movable between extended and retracted positions in response to actuation by a solenoid 40 through fixed insertion tube or rectangular track 42. While the insertion direction axis is shown to be substantially vertical and the feed direction substantially horizontal, it will be appreciated that these directions are merely exemplary and are not critical, although generally the feed direction 30 will be orthogonal to the insertion direction I. Therefore, for purposes of the present invention, and in the claims, the insertion direction is shown to be vertical although any other orientation may be used.

Figure 3:
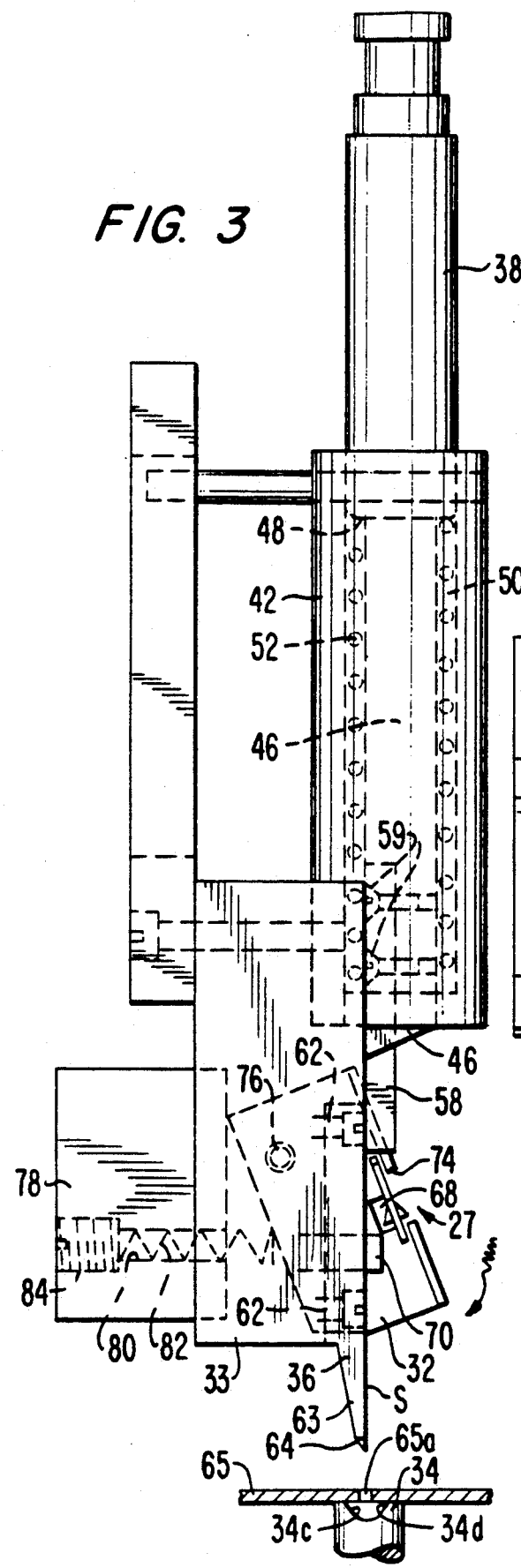
FIG. 3 is side elevational view of the plunger assembly and feedtrack shown in FIG. 2, illustrating the pivotably mounted feedtrack in an extended or outward position which permits advancement of the strip of components without being blocked by a fixed cutting element disposed in the feedpath of the components.

Referring to FIGS. 2 and 3, a first embodiment in accordance with the invention includes a cylindrical cavity 44 within the fixed tube 42. Disposed within the cylindrical cavity 44 is a plunger shaft 46 that has a diameter less than the diameter of the insertion plunger 38 and diameter of the cylindrical cavity 44 so as to produce a shoulder 48 which captures a compression spring 52 within a clearance 50. A guide slot 54 is provided in the fixed insertion tube 42 which captures a dowel stop or pin 56 which serves as a guide within the guide slot 54, thereby limiting the amount of relative movement between the insertion plunger 38 and the fixed tube 42. Thus, the insertion plunger 38 is shown in FIGS. 2 and 3 in its fully retracted position when the solenoid 40 is not actuated, the insertion plunger 38 being resiliently biased or urged upwardly.

As best shown in FIG. 3, an insertion spoon 58 is detachably connected to the plunger shaft 46 by means of screws 59, so as to share common movements with the plunger. The stationary nose or insertion plate 36 is attached to the main mounting block 33 by means of bolts 62. The insertion plate 36 includes a surface S which is aligned with the axis of the anvil 34, so that the surface or plane S passes through the axis of the anvil 34. Depending downwardly below the mounting block 33 is an extension 63 of the nose plate or insertion plate 36 which tapers as shown in FIG. 3, and is provided with two alignment points 64, best shown in FIG. 2. The details of the alignment points are shown in FIGS. 5A and 5B.

Figure 4:
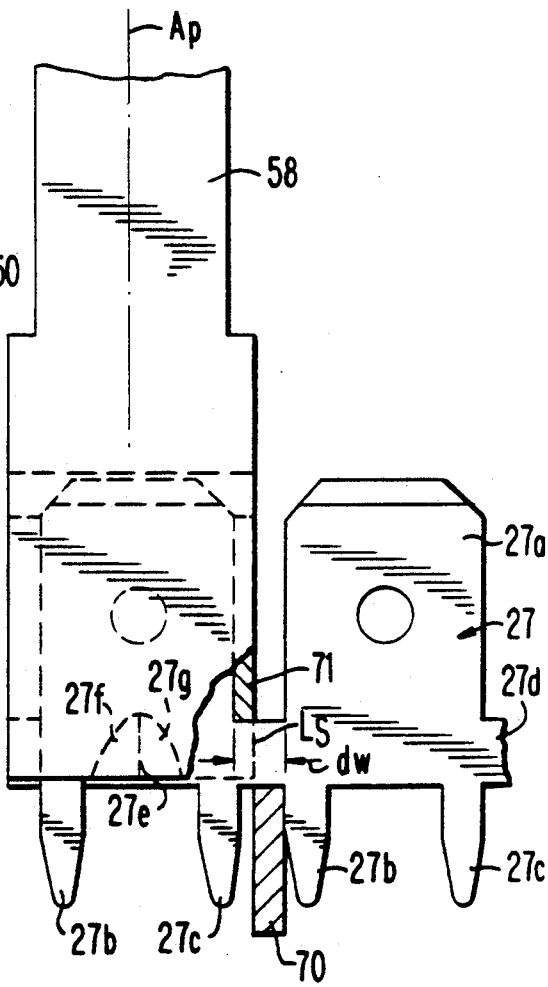
FIG. 4 is an enlarged section of the terminal at the insertion station, showing the cooperation between the lower cutting element and the element mounted on the movable plunger for shearing a web carrier to separate the component or terminal to be inserted from the strip.

The specific configuration of the alignment points are not critical, and the presently preferred embodiment of such points are pyramidal in configuration as suggested by FIGS. 5A and 5B, wherein the points have a height $H_a$ and define inclined edges $\alpha$ of approximately 30 degrees. In the presently preferred embodiment, two spaced points $64a$ and $64b$ are used, shown in FIG. 2, since the terminals to be inserted have two spaced mounting legs, as best shown in FIG. 4. However, for terminals which include only a single leg, the insertion plate 36 can be replaced with one which has only a single alignment point 64. In FIG. 5B, the alignment point 64 is shown to have a flat side $64c$ which is coextensive with the surface S of the insertion plate, and a rearwardly inclined edge $64d$ which defines an angle $\beta$ of approximately 30 degrees with the flat side $64c$. These angles are only illustrative and are not intended to be critical.

Referring to FIG. 4, some details of the terminal 27 disclosed in U.S. Pat. No. 4,688,866 are shown. The details of these terminals will not, however, be described in every detail and the aforementioned patent maybe referred to for additional details. Each terminal 27 includes an upper flat connecting portion $27a$, with two depending mounting legs $27b$ and $27c$. Adjacent terminals are connected to each other by carriers webs $27d$, the lower edges $27d'$ of which define a carrier edge or line.

The lower region of the terminal $27a$ is provided with a central cut line $27e$ which extends from the lower edge and is generally parallel to the mounting legs $27b$ and $27c$. The portions of the terminal to each side of the cut line $27e$ are forced in opposite directions to form stabilizing protuberances $27f$ and $27g$, as more fully described in the aforementioned patent.

In FIG. 4, the spacing between the mounting legs $27b$ and $27c$ is designated by $d_l$, while the spacing between the cut line $27e$ and the center of the carrier web $27d$ is designated as $d_c$. The web carrier $27d$ is shown to have a width $d_w$ along the feed direction 30. Along the height of the web carrier, there is shown a shear line $L_s$ which is a line along which the web carrier is sheared to separate the terminal to be inserted from the upstream portion of the strip.

In FIG. 2, the distance between the alignment points $64a$ and $64b$ is represented by $d_p$ which is equal to the spacing $d_h$ between two holes $65a$ and $65b$ in the substrate or printed circuit board 65. The distances $d_p$ and $d_h$ are equal to the distance $d_l$ between the mounting posts of the terminals.

Referring to FIG. 3, there is provided a clearance slot 68 which is intended to accommodate the lateral protuberances $27f$ or $27g$ which extend beyond the flat surfaces of the terminals $27a$. In this manner, the flat surfaces of the terminals $27a$ can abut and slide against the flat surface S of the insertion plate 36 and maintain the legs $27b$ and $27c$ aligned with the alignment points $64a$ and $64b$. For the same reason, there are provided slots 68 and 74 in the feedtrack 32 and the channel 69 in the insertion plate 36 which are dimensioned to receive the protuberances $27f$ or $27g$ while the flat portions of the terminal strips are advanced in the channel 72 within the feedtrack 32 and subsequently inserted along the insertion plate 36.

In accordance with the first presently preferred embodiment, a fixed cutting blade 70 is provided which remains stationary during the insertion process. Referring to FIGS. 2-4, the cutting blade 70, being fixed, would normally be in the feedpath and contact the mounting legs thereby preventing advancement of the strip 26. In order to overcome this problem, the feedtrack 32 is shown in FIG. 3 to be pivotably mounted about a pin 76 to move the feedtrack 32 between an extended position as shown in FIG. 3, wherein the mounting legs of the terminal strip are moved forwardly of the fixed cutting blade 70 so as to provide a clearance between the mounting legs and the fixed cutting blade. In this extended position of the feedtrack 32, the strip of terminals 26 may be stepwise advanced to bring the next successive terminal to be inserted to the position shown along the insertion axis $A_p$ (FIG. 2). Once the next terminal to be inserted is positioned to align its mounting legs with the alignment points 64 and holes $65a$, $65b$ in the printed circuit board 65, the solenoid 40 is energized to actuate the plunger shaft 46 downwardly, as viewed in the figures, against the action of the spring 52. As can best be seen from FIGS. 2 and 3, the insertion spoon 58 initially receives the upper portion of the terminal strip within a channel $58b$ and lateral movements are avoided by means of lateral spacers or guides $58a$. Once engaged, the insertion spoon 58 continues its descent while capturing the terminal strip 27 within the channel $58b$ and causing the terminal to assume an upright position within the channel. The forces acting on the terminal strip are transmitted to the rest of the strip by means of the connecting web $27d$, and forces are applied to the remainder of the strip to pivot the feedtrack 32 to its retracted position when the terminal strip is placed into abutment against the surface S of the insertion plate 36. Mounted rearwardly of the main mounting block 33, as best shown in FIG. 3, is a spring housing 78 provided with a bore 80 which receives a compression spring 82 which abuts against the feedtrack 32 and urges it outwardly to its normal extended position. Adjustment screw 84 may be used to adjust the spring pressure applied to the feedtrack. Once the terminal strip 27a is received within the spoon channel 58b and the terminal is aligned along the insertion direction, the terminal is ready for insertion.

An important feature of the present invention is the provision of a second cutting element 71, in the nature of a cutting edge on the lower portion of the insertion spoon 58. As best shown in FIG. 4, the strip is advanced so as to place the lower cutting element 70 below the carrier web line or edge 27d' of the carrier web 27d upstream of the shear line $L_s$.

It should be evident, therefore, that continued downward movement of the insertion spoon 58 will cause the cutting edge 71 to move below the upper edge of the cutting element 70 (web carrier aligned) to thereby shear the web carrier 27d along the shear line $L_s$. Continued downward movement of the insertion spoon 58 carries the terminal 27 received within the insertion spoon 58 downwardly until the mounting legs are inserted into the holes 65a, 65b and the legs are splayed when they contact the splaying anvil 34 at splaying surfaces 34a, 34b on the other side of the substrate 65. In order to insure that the legs will be splayed in a common plane, the splaying anvil 34 is preferably provided with inclined surfaces 34c and 34d (FIG. 3) which are inclined downwardly toward each other so as to provide a trough along the insertion axis.

Because the cutting element 71 on the insertion spoon 58 may wear in time, the insertion spoon 58 is detachably connected to the plunger shaft 46 as aforementioned so that it can be easily replaced.

It will be appreciated that the thickness of the cutting elements 70, 71 together total approximately the width $d_w$ of the carrier web being sheared. In this manner, the remaining terminals are maintained stationary during the shearing process by virtue of the lateral support provided by the shearing or cutting elements.

Referring to FIG. 6, a second embodiment is illustrated in which the lower cutting element corresponding to the cutting element 70 in FIGS. 1-4 is replaced by a retractable cutting element or blade 86. In FIG. 6, the retractable cutting element is shown in its extended position wherein it is in the path of movement of the terminal strip 27a. In order to stepwise advance the next terminal strip to be moved to the insertion position or at the insertion station, the retractable cutting element 86 is retracted, as suggested by the arrow in FIG. 6. This is effected by means of a bore 88 provided in the main housing block 33 on which there is mounted a solenoid 90 as shown. The solenoid 90 has a shaft 92 which is mechanically coupled to the retractable cutting element 86. A compression spring 94 normally maintains the retractable cutting element 86 in its extended position as shown. However, when the carrier strip is to be advanced by one terminal, the solenoid 90 can be actuated, manually or automatically. Retraction of the cutting blade 86 allows the next terminal to be inserted to be advanced to the insertion position without engaging the cutting element 86, and the retractable cutting element 86 is brought to a position similar to the position of the cutting element 70 in FIG. 4. Aside from a different method of providing relative movement between the carrier strip and the lower cutting element, the operation of the two embodiments is similar.

In order to accommodate the protuberances 27f and 27g, the insertion spoon 58 can be provided with a taper 58c (FIG. 6) which engages the protuberance 27g, thereby permitting the terminal 27a to be received within the channel 58b and maintaining the terminal in a vertical orientation parallel to the insertion direction.

With both embodiments, the terminals to be inserted can initially be severed from the continuous strip by cutting the carrier web separating the terminal to be inserted from the rest of the strip and subsequently inserted into selected holes in the substrate surface with a single stroke of the plunger 46.

In operation, a printed circuit board of substrate 65 is inserted within the space 18 of the machine and the alignment points 64a and 64b are inserted into the holes 65a and 65b into which the mounting legs 27b and 27c of a terminal 27 are to be inserted. To do this, the printed circuit board 65 is moved upwardly so as to engage the alignment points 64. The insertion plate 36, alignment points 64 and the splaying anvil 34 are all fixed or stationary. Once the holes have been aligned, the solenoid 40 is actuated, such as by a manual foot pedal which actuates a hydraulic circuit. Actuation of the solenoid 40 causes the insertion plunger 38 and plunger shaft 46 to move downwardly with the insertion spoon 58 in close proximity to the surface S of the insertion plate. Preferably, the insertion spoon 58 slides against or is in very close proximity to the surface S of the insertion plate. With the embodiment of FIGS. 2-3, the insertion spoon 58 initially captures the upper end of the terminal strip 27a into a channel 58b, forcing the terminal to upright itself when forced into the channel 58b. These uprighting forces are transmitted to the rest of the strip and the feedtrack 32 through the web carrier connecting the engaged terminal strip with the rest of the strip. Such uprighting of the rest of the strip as well as the feedtrack 32 brings the lower edge of the web carrier 27d into abutment against the upper edge of the lower cutting element 70. Once the web carrier is fixed and supported by the lower cutting element, the upper cutting element 71 can shear the carrier web by continued downward movement as suggested in FIG. 4. As soon as the carrier web 27d is severed, the forces maintaining the rest of the strip and the feedtrack 32 in a retracted, upright position are removed and the strip as well as the feedtrack 32 revert to the extended position by the action of the compression spring 82 to the position shown in FIG. 3. Now, an advancing mechanism may be actuated, manually or automatically, to advance the next successive terminal to be inserted past the fixed cutting element 70 without being blocked by the cutting element.

The operation of the second embodiment shown in FIG. 6 is, as suggested, similar as with the first embodiment, except that there is no pivoting track and the strip of terminals is always maintained in a single plane. When the strip is to be advanced, the solenoid 90 is actuated, causing the cutting element 86 to be retracted so that it does not extend into the path of movement of the strip and clears the mounting legs of the terminals. Once the terminal is in the insertion position, the solenoid 90 is deactivated, and the compression spring 94 reverts the cutting element 86 to its extended position, similar to that of the cutting element 70 in FIG. 4. The action of the insertion spoon 58 and the second or upper cutting element 71 is the same with the first embodiment.

It is to be understood that the embodiments described herein are merely illustrative of the principles of the invention. Various modifications may be made thereto by persons skilled in the art which may embody the principles of the invention and fall within the spirit and scope thereof.

We claim:

1. An apparatus for individually inserting successive components of a series of components having mounting legs by movement of the components along an insertion direction to introduce the mounting legs into holes in a substrate at an insertion station, the components being uniformly spaced and arranged in an elongate strip with adjacent components being connected to each other by carrier webs each defining a carrier line on the side of the mounting legs, the apparatus comprising dispensing means for dispensing the strip of components; guide means for guiding the dispensed strip of components along a feedpath generally normal to said insertion direction with the mounting legs oriented in the direction of the substrate surface; advancing means for stepwise advancing the strip after each insertion operation to position the next successive components of the strip at the insertion station, and centering the carrier web between the components to be inserted and the next successive upstream components relative to a web shearing line; a first cutting element at said insertion station arranged for abutment against a carrier line for preventing movement of a portion of the carrier web upstream of said shearing line in a direction relative to said insertion direction, means for providing relative movement between the strip and said cutting element to permit the strip to advance the next successive component to be inserted to said insertion station without being blocked by said first cutting element; plunger means mounted for movement along said insertion direction and normally disposed at a position on the opposite side of said carrier line and provided with a second cutting element arranged relative to said first cutting element to shear a carrier web when said plunger is driven into engagement with that portion of the carrier web downstream of said shearing line and moved below said carrier line; and an insertion spoon for receiving and carrying the component towards and inserting the mounting legs through the substrate, whereby the component to be inserted is initially moved to said insertion station, it is subsequently severed from the strip by cutting the carrier web and subsequently inserted into selected holes in the substrate surface in a single stroke of said plunger means and said insertion spoon.

2. An apparatus as defined in claim 1, wherein said first cutting element projects into said feedpath and remains stationary during advancement of the strip, said means for providing relative movement comprises a pivotably mounted feedtrack which forms part of said guide means and which is movable between a normally extended position which moves the mounting legs beyond said feedpath to clear said first cutting blade during advancement of the strip and a retracted position which moves the carrier web to be sheared into abutment with said first cutting blade above said carrier line and orients the mounting legs substantially parallel to said insertion direction just prior to insertion.

3. An apparatus as defined in claim 2, wherein said feedtrack is spring biased to said extended position, said insertion means including said insertion spoon for engaging the component to be inserted and urging the component to move to a position for insertion, whereby said feedtrack is moved to said retracted position through the force applied from the component to be inserted to the rest of the strip through the carrier web and whereby cutting of the carrier web causes said feedtrack to return to said extended position.

4. An apparatus as defined in claim 1, wherein the components are flat terminal strips provided with stabilizing protuberances above the legs, said guide means including a clearance slot for accommodating the stabilizing protuberances.

5. An apparatus as defined in claim 1, wherein said second cutting element is detachably connected to said plunger means, whereby said second cutting element can be replaced without replacing said plunger means.

6. An apparatus as defined in claim 1, wherein adjacent components are spaced from each other a predetermined distance and connected by the carrier webs, and wherein the thickness of said first and second cutting elements along said feedpath are together substantially equal to said predetermined distance.

7. An apparatus as defined in claim 1, further comprising a splaying anvil below said first cutting element.

8. An apparatus as defined in claim 1, further comprising alignment means for aligning the holes in a substrate with the mounting legs of a component to be mounted.

9. An apparatus as defined in claim 8, wherein said alignment means comprises an alignment point configured to be partially received within a hole into which a mounting leg is to be inserted.

10. An apparatus as defined in claim 9, wherein said alignment point is pyramidical in shape.

11. An apparatus as defined in claim 9, wherein the component has two legs spaced from each other, and wherein two alignment points are provided spaced from each other to correspond to the spacing between the legs of the component.

12. An apparatus as defined in claim 8, further comprising a splaying anvil spaced sufficiently below said alignment means to permit the insertion of a substrate between said splaying anvil and alignment means.

13. An apparatus as defined in claim 1, wherein said second cutting element is slidably mounted for movement into and out of the feed path; and said means for providing relative movement comprises spring means for normally extending said second cutting element into said feedpath to be in a position to shear a carrier web; and actuating means for controllably retracting said second cutting element out of said feedpath.

14. An apparatus as defined in claim 13, wherein said actuating means comprises a solenoid mechanically coupled to said second cutting element.

15. An apparatus as defined in claim 13, wherein the components are flat terminals provided with stabilizing protuberances above the legs, said guide means including a clearance slot for accommodating the stabilizing protuberances.

16. An apparatus as defined in claim 1, further comprising a stationary nose plate having a surface coextensive with said insertion direction and extending substantially along the entire stroke of travel of said insertion spoon.

17. An apparatus as defined in claim 16, wherein the components are flat and have protuberances projecting from the flat surfaces thereof, said nose plate having a channel for receiving said protuberances while the flat components are driven in the insertion direction.

18. A method of individually inserting a series of components having mounting legs into holes in a substrate surface at an insertion station, the components being uniformly spaced and arranged in an elongate strip with adjacent components being connected to each other by carrier webs, the method comprising the steps of dispensing the strip of components; guiding the dispensed strip of components along a feedpath generally normal to an insertion direction with the mounting legs oriented in the direction of the substrate surface; stepwise advancing the strip after each insertion operation to position the next successive element of the strip at the insertion station and centering the carrier web between the component to be inserted and the next successive upstream component relative to a web shearing line; shearing the carrier web connecting a component to be inserted with the next successive upstream component with a cutting element in the feedpath; inserting the component separated from the strip into a substrate surface, said shearing and inserting steps forming part of a common stroke along an insertion direction; and providing relative movement between the cutting element and the mounting legs of the components to avoid contact between the mounting legs and the cutting element to permit the strip to be stepwise advanced to position the next successive component to be mounted at the insertion station.

19. A method as defined in claim 18, wherein said step of providing relative movement between the cutting element and the mounting legs comprises the step of moving the strip to clear the feedpath of the cutting element during advancement of the strip.

20. A method as defined in claim 18, wherein said step of providing relative movement between the cutting element and the mounting legs comprises selectively retracting the cutting element from the feedpath during advancement of the strip.

* * * * *